United States Patent
Li et al.

(10) Patent No.: US 7,788,630 B2
(45) Date of Patent: Aug. 31, 2010

(54) METHOD AND APPARATUS FOR DETERMINING AN OPTICAL MODEL THAT MODELS THE EFFECT OF OPTICAL PROXIMITY CORRECTION

(75) Inventors: Jianliang Li, Hillsboro, OR (US); Qilang Yan, Portland, OR (US); Lawrence S. Melvin, III, Hillsboro, OR (US)

(73) Assignee: Synopsys, Inc., Mountain View, CA (US)

( * ) Notice: Subject to any disclaimer, the term of this patent is extended or adjusted under 35 U.S.C. 154(b) by 539 days.

(21) Appl. No.: 11/726,505

(22) Filed: Mar. 21, 2007

(65) Prior Publication Data

US 2008/0235651 A1 Sep. 25, 2008

(51) Int. Cl.
- *G06F 17/50* (2006.01)
- *G06F 9/45* (2006.01)
- *G03F 1/00* (2006.01)

(52) U.S. Cl. .................. 716/21; 716/1; 716/2; 716/4; 716/5; 716/19; 430/5

(58) Field of Classification Search .................. 716/19, 716/21; 430/5; 703/2; 358/406
See application file for complete search history.

(56) References Cited

U.S. PATENT DOCUMENTS

| | | | | |
|---|---|---|---|---|
| 6,927,003 B2 * | 8/2005 | Kim et al. | | 430/5 |
| 7,458,059 B2 * | 11/2008 | Stirniman et al. | | 716/21 |
| 7,512,927 B2 * | 3/2009 | Gallatin et al. | | 716/19 |
| 7,627,837 B2 * | 12/2009 | Zhang | | 716/2 |
| 7,681,172 B2 * | 3/2010 | Zhang et al. | | 716/19 |
| 7,689,968 B2 * | 3/2010 | Sato | | 716/19 |
| 7,694,267 B1 * | 4/2010 | Ye et al. | | 716/19 |
| 7,703,069 B1 * | 4/2010 | Liu et al. | | 716/19 |
| 7,707,538 B2 * | 4/2010 | Wong et al. | | 716/19 |
| 2006/0141366 A1 * | 6/2006 | Parikh et al. | | 430/5 |
| 2007/0282574 A1 * | 12/2007 | Huang et al. | | 703/2 |
| 2008/0068667 A1 * | 3/2008 | Tejnil | | 358/406 |
| 2008/0068668 A1 * | 3/2008 | Shi et al. | | 358/406 |
| 2008/0204690 A1 * | 8/2008 | Berger et al. | | 355/67 |
| 2008/0276211 A1 * | 11/2008 | Li et al. | | 716/9 |
| 2009/0070730 A1 * | 3/2009 | Zhang et al. | | 716/19 |

OTHER PUBLICATIONS

Allgair et al.; "The Future of CD Metrology"; Publication Year: 2006; Semiconductor Manufacturing, 2006. ISSM 2006. IEEE International Symposium on; pp. 91-94.*

(Continued)

*Primary Examiner*—Helen Rossoshek
(74) *Attorney, Agent, or Firm*—Park, Vaughan & Fleming LLP; Laxman Sahasrabuddhe

(57) ABSTRACT

One embodiment provides a system that can enable a designer to determine the effects of subsequent processes at design time. During operation, the system may receive a test layout and an optical model that models an optical system, but which does not model the effects of subsequent processes, such as optical proximity correction (OPC). The system may generate a first dataset using the test layout and the optical model. Next, the system may apply OPC to the test layout, and generate a second dataset using the corrected test layout and the optical model. The system may then use the first dataset and the second dataset to adjust the optical model to obtain a second optical model that models the effects of subsequent processes.

20 Claims, 3 Drawing Sheets

OTHER PUBLICATIONS

Li et al.; "Transferring Optical Proximity Correction (OPC) Effect into Optical Mode"; Publication Year: 2007; Quality Electronic Design, 2007. ISQED '07. 8th International Symposium on; pp. 771-775.*

Wang et al.; :Algorithm for yield driven correction of layout; Publication Year: 2004; Circuits and Systems, 2004. ISCAS '04. Proceedings of the 2004 International Symposium on; vol. 5; pp. V-241-V-245 vol. 5.*

* cited by examiner

METHOD AND APPARATUS FOR DETERMINING AN OPTICAL MODEL THAT MODELS THE EFFECT OF OPTICAL PROXIMITY CORRECTION

BACKGROUND

1. Field of the Invention

The present invention relates to semiconductor design and manufacturing. More specifically, the present invention relates to a method and an apparatus for determining an optical process model that can model the effects of optical proximity correction.

2. Related Art

Rapid advances in computing technology have made it possible to perform trillions of computational operations each second on datasets that are sometimes as large as trillions of bytes. These advances can be attributed to the dramatic improvements in semiconductor design and manufacturing technologies which have made it possible to integrate tens of millions of devices onto a single chip. Optical proximity correction (OPC) techniques continue to play an important role as semiconductor design enters the deep submicron era.

Model-based OPC techniques typically use a process model to correct a design layout. The process model enables an OPC technique to ensure that the corrected mask pattern will result in a reasonable approximation of the design intent that is desired to be created on the wafer.

If a chip designer does not have accurate information about the effects of downstream processes, some manufacturing problems may not be identified until at a very late stage in the design flow. Hence, it is generally desirable to provide a chip designer with as much information as possible about the effects of downstream processes, thereby enabling the designer to solve manufacturing problems at an early stage in the design flow.

SUMMARY

One embodiment provides a system that can enable a designer to determine the effects of subsequent processes at design time. A designer can use an embodiment to determine manufacturing problems that may remain unsolved after performing optical proximity correction (OPC).

An embodiment may receive a test layout and an optical model that models an optical system, but which does not model the effects of subsequent processes, such as OPC. Next, the system may generate a first dataset using the test layout and the optical model. The system may then obtain a second test layout by applying subsequent processes, such as OPC, to the test layout. Next, the system may generate a second dataset using the second test layout and the optical model. The system may then use the first dataset and the second dataset to adjust the optical model so that it models the effects of subsequent processes. In one embodiment, the system can determine a matrix using the first dataset and the second dataset, wherein multiplying the matrix with the optical model generates an enhanced optical model which models the effects of subsequent processes in addition to modeling the optical system.

One embodiment may receive a first optical model that models an optical system, but which does not model the effects of subsequent processes, such as OPC. Next, the system may receive a matrix that captures the effects of subsequent processes. The system may then determine a second optical model using the first optical model and the matrix. The second optical model may model the effects of subsequent processes in addition to modeling the optical system.

An embodiment can receive a layout on which OPC has not been performed. Next, the system may receive an optical model, which, in addition to modeling an optical system, also models the effects of subsequent design and/or manufacturing processes. The system can then generate a contour using the layout and the optical model. The contour predicts a pattern that would be generated if the layout is subjected to photolithography, and then is subjected to the subsequent processes.

DETAILED DESCRIPTION

Integrated Circuit (IC) Design Flow

Figure 1:
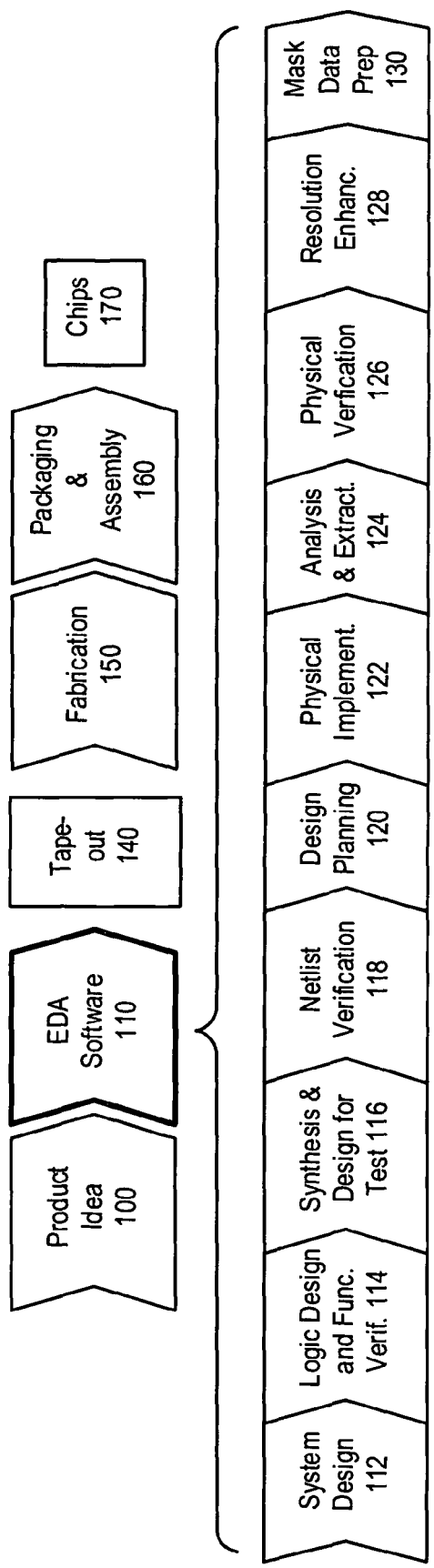
FIG. 1 illustrates various steps in the design and fabrication of an integrated circuit in accordance with an embodiment of the present invention.

FIG. 1 illustrates various steps in the design and fabrication of an integrated circuit in accordance with an embodiment of the present invention.

The process starts with the conception of the product idea (step 100) which is realized using an EDA software design process (step 110). When the design is finalized, it can be taped-out (event 140). After tape out, the fabrication process (step 150) and packaging and assembly processes (step 160) are performed which ultimately result in finished chips (result 170).

The EDA software design process (step 110), in turn, comprises steps 112-130, which are described below. Note that the design flow description is for illustration purposes only. This description is not meant to limit the present invention. For example, an actual integrated circuit design may require the designer to perform the design steps in a different sequence than the sequence described below. The following discussion provides further details of the steps in the design process.

System design (step 112): In this step, the designers describe the functionality that they want to implement. They can also perform what-if planning to refine functionality, check costs, etc. Hardware-software architecture partitioning can occur at this stage. Exemplary EDA software products from Synopsys, Inc. that can be used at this step include Model Architect, Saber, System Studio, and DesignWare® products.

Logic design and functional verification (step 114): At this stage, the VHDL or Verilog code for modules in the system is written and the design is checked for functional accuracy.

More specifically, the design is checked to ensure that it produces the correct outputs. Exemplary EDA software products from Synopsys, Inc. that can be used at this step include VCS, VERA, DesignWare®, Magellan, Formality, ESP and LEDA products.

Synthesis and design for test (step 116): Here, the VHDL/Verilog is translated to a netlist. The netlist can be optimized for the target technology. Additionally, tests can be designed and implemented to check the finished chips. Exemplary EDA software products from Synopsys, Inc. that can be used at this step include Design Compiler®, Physical Compiler, Test Compiler, Power Compiler, FPGA Compiler, Tetramax, and DesignWare® products.

Netlist verification (step 118): At this step, the netlist is checked for compliance with timing constraints and for correspondence with the VHDL/Verilog source code. Exemplary EDA software products from Synopsys, Inc. that can be used at this step include Formality, PrimeTime, and VCS products.

Design planning (step 120): Here, an overall floorplan for the chip is constructed and analyzed for timing and top-level routing. Exemplary EDA software products from Synopsys, Inc. that can be used at this step include Astro and IC Compiler products.

Physical implementation (step 122): The placement (positioning of circuit elements) and routing (connection of the same) occurs at this step. Exemplary EDA software products from Synopsys, Inc. that can be used at this step include the Astro and IC Compiler products.

Analysis and extraction (step 124): At this step, the circuit function is verified at a transistor level, this in turn permits what-if refinement. Exemplary EDA software products from Synopsys, Inc. that can be used at this step include AstroRail, PrimeRail, Primetime, and Star RC/XT products.

Physical verification (step 126): In this step, the design is checked to ensure correctness for manufacturing, electrical issues, lithographic issues, and circuitry. Exemplary EDA software products from Synopsys, Inc. that can be used at this step include the Hercules product.

Resolution enhancement (step 128): This step involves geometric manipulations of the layout to improve manufacturability of the design. Exemplary EDA software products from Synopsys, Inc. that can be used at this step include Proteus, ProteusAF, and PSMGen products.

Mask data preparation (step 130): This step provides the "tape-out" data for production of masks to produce finished chips. Exemplary EDA software products from Synopsys, Inc. that can be used at this step include the CATS(R) family of products.

Embodiments of the present invention can be used during one or more of the above-described steps. An embodiment of the present invention can be used during the resolution enhancement step 128.

Process Information

Accurate information about a semiconductor manufacturing process is usually not available at design time. The effects of downstream processes are typically captured in a set of design rules. However, at deep submicron dimensions, the set of design rules can easily become unmanageably large. In addition, design rules are usually incomplete because they are typically created before complete process data is available.

As process nodes become smaller, more accurate process information is needed. An approach is to use early process data to generate design rules. However, this methodology can be inaccurate because manufacturing processes may change after the design rules are created. The early process data can be supplemented using model-based simulation. However, the simulation is only as accurate as the process data that was used to create the process model.

The need to choose a final set of design rules before the process is finalized leads to design rules that miss some problems and that are over constrained in other areas. To eliminate these drawbacks, the integration of real process data into the design flow is helpful. By using real process data, a design only needs to be constrained when the constraint is truly necessary.

Process simulation can be accomplished through the use of process models. Process models usually include photoresist and may include the etch process. Models can be constructed using a set of kernels that are weighted using a set of coefficients. The coefficient values can be determined by fitting the coefficients to process data using statistical techniques. A model can be specially formulated to produce very fast convolution times. Model-based simulation usually provides information at an evaluation point in the layout.

One embodiment enables a designer to obtain detailed and accurate process information during design time. A designer can use an embodiment to determine manufacturing problems that may not be solved by OPC. Conventional techniques do not model OPC effects, and hence, they do not enable a designer to identify manufacturing problems that won't be solved by OPC.

Design for Manufacture (DFM) Flow

A technique for analyzing manufacturing problems in a DFM flow is to run the complete tapeout flow on the design. The complete tapeout flow involves a design rule check (DRC), the application of resolution enhancement techniques (RET), the application of optical proximity correction (OPC), and the analysis of processes in a lithography rule check (LRC) step. In summation, this flow is referred to as a lithography compliance check (LCC) flow. Unfortunately, this technique can be computationally intensive and time consuming because it requires the entire tapeout flow be performed on the pattern.

Figure 2:
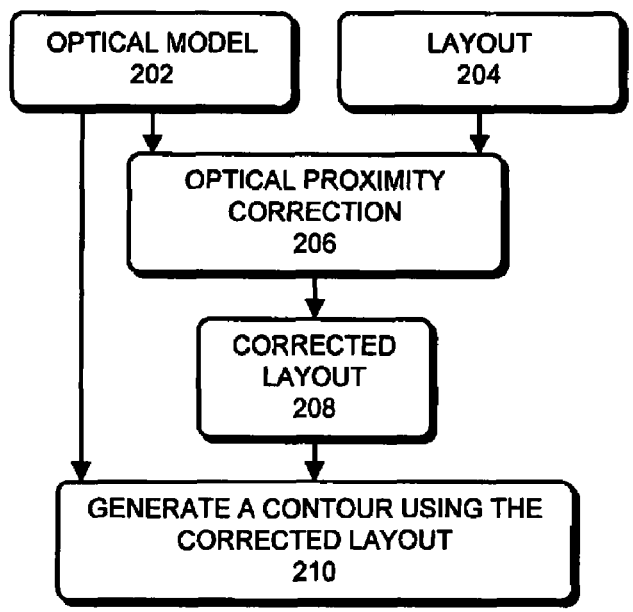
FIG. 2 presents a flowchart that illustrates how a designer can analyze manufacturing problems in a layout in accordance with an embodiment of the present invention.

FIG. 2 presents a flowchart that illustrates how a designer can analyze manufacturing problems in a layout in accordance with an embodiment of the present invention.

Typically the process starts by applying optical proximity correction 206 to design layout 204 to obtain corrected layout 208. The system may perform optical proximity correction 206 using optical model 202. The optical model 202 may model the photolithography process. However, optical model 202 does not model the effects of optical proximity correction 206. Once the designer has the corrected layout 208, the designer can use optical model 202 to generate a contour using the corrected layout (stage 210). The contour predicts the pattern that is expected to be printed on the photoresist and/or wafer. The designer can then compare the contour with the design intent to determine whether the layout has manufacturing problems, and change the design if needed.

There can be several paradigms for the use of process data from an LCC flow during design. An LCC flow can be performed just prior to tapeout, effectively as a model-based DRC. An LCC flow can be used during device design for work on optimizing standard cells for functionality and manufacturing. LCC can also be used during the place and route phase to improve manufacturability. Further, different applications of the LCC flow may require different accuracy levels in the underlying process data. However, these uses are predicated on reasonable turnaround times for gathering process data. Unfortunately, an exact copy of the process flow during LCC for the purpose of understanding device manufacturing constraints can be very time consuming.

One embodiment of the present invention can drastically reduce LCC runtime for the purpose of using LCC process data for various design tasks. An embodiment creates a physical model of the manufacturing process and a statistical model of the OPC and RET. The embodiment can reduce the processing time by an order or magnitude, and at the same time be accurate and extrapolate well.

Process for Determining an Optical Model

Figure 3:
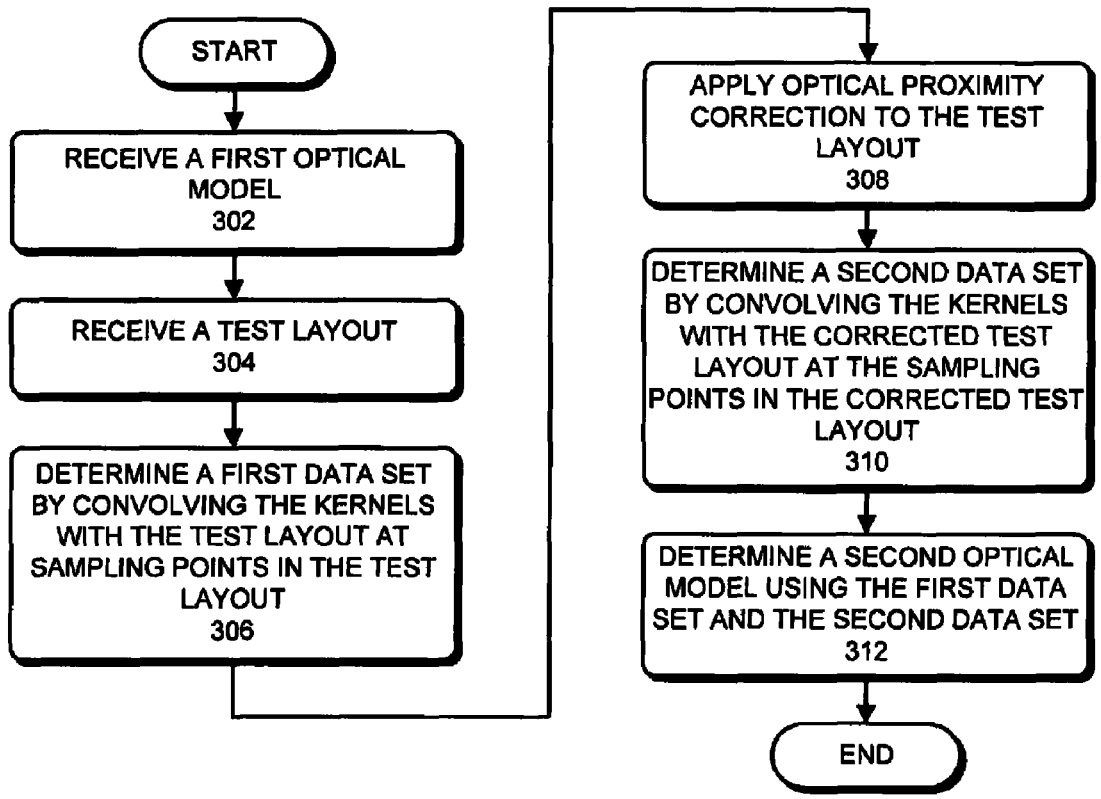
FIG. 3 presents a flowchart that illustrates a process for determining an optical model that models the effects of optical proximity correction in accordance with an embodiment of the present invention.

FIG. 3 presents a flowchart that illustrates a process for determining an optical model that models the effects of optical proximity correction in accordance with an embodiment of the present invention.

The process usually begins by receiving a first optical model which is represented using kernels (step 302). The first optical model may model the effects of a photolithography process, but may not model the effects of optical proximity correction.

A process model can be a physical model, i.e., the model can be based on a physical equation that models the process. For example, the well known Hopkin's Equation can be used as the starting point for a photolithography process model. The coefficients of a process model can be fit to process data collected from the manufacturing process in the wafer fab. The physical model usually has good extrapolation properties. Extrapolation is the ability of the model to predict pattern behavior beyond the physical data used to fit the model.

A statistical model, also known as a black box model, typically uses a high order equation whose coefficients are fit to process data. These types of models predict well around the input physical data points, but may loose accuracy as they extrapolate beyond those points. The statistical model is normally used when the process cannot be modeled using physical equations. For example, the OPC process may be modeled using a statistical model. The OPC process is difficult to model using a physical model because the process contains many step changes and other nonlinear effects.

The aerial image intensity can be determined using a photolithography process model that is based on the Hopkin's equation. This can be accomplished by decomposing the partially coherent optical system into optical kernels. Next, the mask pattern can be convolved with the optical kernels to obtain the optical signal at a point on the wafer. This process can be expressed as:

$$I_0(x,y) = M_0^T \otimes UU^T \otimes M_0, \quad (1)$$

where, $I_0(x,y)$ is the optical signal at location $(x,y)$, $M_0$ is the mask transmission function, $M_0^T$ is the transpose of $M_0$, the symbol "$\otimes$" represents convolution, and U is an eigenmatrix decomposed from the transmission cross coefficient (TCC) matrix, which characterizes an optical system as a 4D (four dimensional) linear filter. Further information on the TCC and other aspects of the well known Hopkins model can be found in Alfred Kwok-Kit Wong, *Optical Imaging in Projection Microlithography*, SPIE-International Society for Optical Engine, 2005, and Grant R. Fowles, *Introduction to Modern Optics*, 2nd Edition, Dover Publications, 1989.

Continuing with the flowchart in FIG. 3, the system can then receive a test layout (step 304). The test layout can be a layout to which optical proximity correction has not been applied.

Figure 4A:
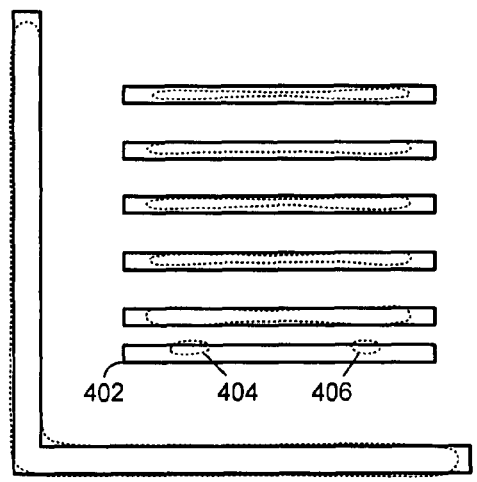
FIG. 4A illustrates a test layout in accordance with an embodiment of the present invention.

FIG. 4A illustrates a test layout in accordance with an embodiment of the present invention.

The test layout shown in FIG. 4A includes patterns, such as polygon 402. OPC has not been applied to the test layout shown in FIG. 4A. The test layout may represent the design intent that is required to be printed on the wafer. Alternatively, the test layout may represent the patterns that need to be printed on the photoresist, which will eventually cause the design intent to be printed on the wafer.

The system can then determine a first dataset by convolving the kernels with the test layout at sampling points in the test layout (step 306).

For example, the system may use equation (1) to obtain the first dataset. The system may dissect the layout into segments, and may select the midpoints of the segments as sampling points. Alternatively, the system may use another technique to determine a set of sampling points. Next, the system can convolve each kernel in the optical model with the test layout at each sampling point to obtain the first dataset.

When the optical model is applied to the test layout, an uncorrected contour may be obtained. The contour obtained from the original optical model and the original pattern may need significant improvement, which is normally achieved through model-based OPC and RET. For example, FIG. 4A illustrates the contours obtained from the uncorrected layout (the contours are shown using dotted lines). Note that contours 404 and 406 are very different from the design intent, i.e., polygon 402.

The system can then apply optical proximity correction to the test layout (step 308) to obtain a corrected test layout.

Figure 4B:
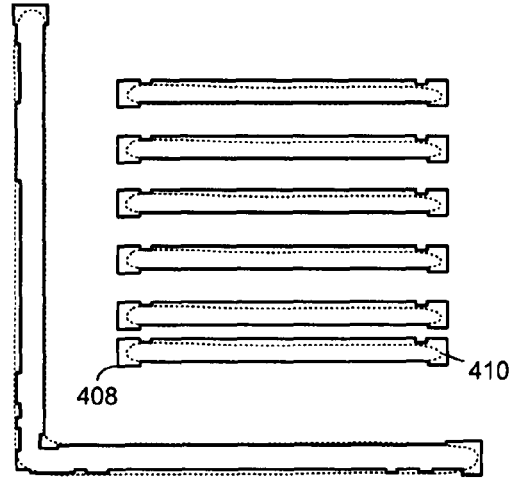
FIG. 4B illustrates a corrected test layout in accordance with an embodiment of the present invention.

FIG. 4B illustrates a corrected test layout in accordance with an embodiment of the present invention.

The system may apply OPC to test layout shown in FIG. 4A to obtain the corrected test layout shown in FIG. 4B. For example, polygon 402 may be corrected using OPC to obtain polygon 408.

The system can then determine a second dataset by convolving the kernels with the corrected test layout at the sampling points in the corrected test layout (step 310).

The system may determine the aerial image intensity using the following expression:

$$I_{OPC}(x,y) = M_{OPC}^T \otimes UU^T \otimes M_{OPC}, \quad (2)$$

where, $I_{OPC}(x,y)$ is the optical signal at location $(x,y)$, and $M_{OPC}$ represents the transmission function of the corrected mask.

The system can convolve the kernels of the optical model with the corrected test layout at the same sampling points that were used to generate the first dataset. The effective contour after OPC is shown in FIG. 4B using dotted lines. The contour can be obtained by applying the same optical model that was used for generating the contours in FIG. 4A. Note that contour 410's shape is substantially similar to polygon 402's shape.

At this point in the process, the system typically has two convolution values for each kernel at each sampling point. One value is associated with the uncorrected test layout and the other is associated with the corrected test layout.

Next, the system can determine a second optical model using the first dataset and the second dataset (step 312). The second optical model may model the effects of optical proximity correction in addition to modeling the photolithography process.

One embodiment uses the first dataset and the second dataset to determine matrix A so that $$M_{OPC}^T \otimes U \approx M_0^T \otimes UA. \quad (3)$$

Note that the convolution $M_0^T \otimes U$ is used to generate the first dataset and the convolution $M_{OPC}^T \otimes U$ is used to generate the second dataset. Note that equation (3) indicates that the two sides of the equation may be approximately equal to one another. This is because it may be impossible to determine a matrix that exactly satisfies the equation at all sample points. However, when such a matrix exists, the "approximately equal" sign in equation (3) should be interpreted as an equality sign.

In one embodiment, in addition to the aerial image intensity contribution from each kernel, the gradient and the curvature of the optical signal can be determined at each sampling point. Next, the matrix A can be determined so that it satisfies equation (3).

One embodiment uses a least square fit to determine matrix A. Specifically, matrix A can be determined by solving for a least square fit using equation (3) as follows:

$$\begin{pmatrix} M_{OPC,1}^T \otimes K_1 & \cdots & M_{OPC,1}^T \otimes K_m \\ \vdots & \ddots & \vdots \\ M_{OPC,n}^T \otimes K_1 & \cdots & M_{OPC,n}^T \otimes K_m \end{pmatrix} \approx \begin{pmatrix} M_{0,1}^T \otimes K_1 & \cdots & M_{0,1}^T \otimes K_m \\ \vdots & \ddots & \vdots \\ M_{0,n}^T \otimes K_1 & \cdots & M_{0,n}^T \otimes K_m \end{pmatrix} \cdot A, \quad (4)$$

where $M_{OPC,i}^T \otimes K_j$ is the convolution of the corrected test layout with kernel $K_j$ at sample point i, and $M_{0,i}^T \otimes K_j$ is the convolution of the uncorrected test layout with kernel $K_j$ at sample point i. The above expression indicates that there are m kernels in the optical model, and that there are n sampling points in the test layout. Note that matrix A is an m×m matrix. The $M_{0,i}^T \otimes K_j$ values may belong to the first dataset, and the $M_{OPC,i}^T \otimes K_j$ values may belong to the second dataset. Note that equation (4) indicates that the two sides of the equation may be approximately equal to one another. This is because it may be impossible to determine matrix A that exactly satisfies the equation. However, when such a matrix exists, the "approximately equal" sign in equation (4) should be interpreted as an equality sign.

Once matrix A is determined, the second optical model can be expressed as U·A. The second optical model can be used to determine a pattern that a mask layout is expected to create on a resist layer. The system may represent the second optical model as a summation of weighted kernels, wherein the kernels are weighted using kernel coefficients. The system may store the kernel identifiers and the corresponding kernel coefficients in a computer-readable storage-medium. A system may then load the optical model by reading the kernel identifiers and the corresponding kernel coefficients from the computer-readable storage-medium.

Figure 5:
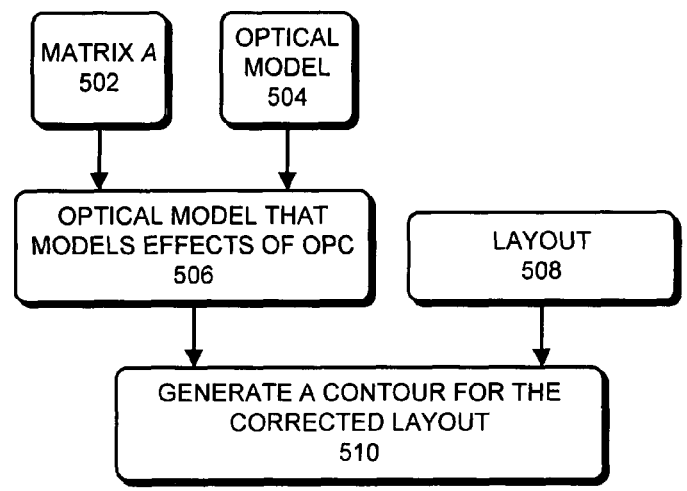
FIG. 5 presents a flowchart that illustrates how an optical model that models the effects of optical proximity correction can be used to determine a contour in accordance with an embodiment of the present invention.

FIG. 5 presents a flowchart that illustrates how an optical model that models the effects of optical proximity correction can be used to determine a contour in accordance with an embodiment of the present invention.

The system may receive a first optical model (step 504) which does not model the effects of OPC. Next, the system may receive matrix A (step 502) which captures the effects of OPC with respect to the first optical model. The system may then use matrix A and the optical model to determine a second optical model that models the effects of OPC (step 506).

Next, the system may receive a layout (step 508) on which OPC has not been performed. Next, the system may determine a contour using the layout and the second optical model (step 510). Note that the contour predicts a pattern that would be generated if the layout is corrected using optical proximity correction and then printed using the photolithography process.

The system may first determine a set of values by convolving the second optical model with the layout at a set of evaluation points in the layout. Next, the system may determine the contour by comparing the set of values with a threshold.

CONCLUSION

The data structures and code described in this detailed description are typically stored on a computer-readable storage medium, which may be any device or medium that can store code and/or data for use by a computer system. This includes, but is not limited to, volatile memory, non-volatile memory, magnetic and optical storage devices such as disk drives, magnetic tape, CDs (compact discs), DVDs (digital versatile discs or digital video discs), or other media capable of storing computer readable media now known or later developed.

Furthermore, the foregoing descriptions of embodiments of the present invention have been presented only for purposes of illustration and description. They are not intended to be exhaustive or to limit the present invention to the forms disclosed. Accordingly, many modifications and variations will be readily apparent to practitioners skilled in the art. Additionally, the above disclosure is not intended to limit the present invention. The scope of the present invention is defined by the appended claims.

What is claimed is:

1. A computer-executed method for determining an optical model that models effects of optical proximity correction, the method comprising:
   receiving by computer a first optical model which is represented using kernels;
   receiving by computer a test layout;
   determining by computer a first dataset by convolving the kernels with the test layout at sampling points in the test layout;
   applying by computer optical proximity correction to the test layout to obtain a corrected test layout, wherein the optical proximity correction is determined using the first optical model;
   determining by computer a second dataset by convolving the kernels with the corrected test layout at the sampling points in the corrected test layout; and
   determining by computer a second optical model using the first dataset and the second dataset, wherein convolving the second optical model with the test layout is substantially equal to convolving the first optical model with the corrected test layout.

2. The method of claim 1,
   wherein the first optical model models effects of a photolithography process, but does not model effects of optical proximity correction; and
   wherein the second optical model models effects of the photolithography process and optical proximity correction.

3. The method of claim 2, comprising:
   receiving a first layout to which optical proximity correction has not been applied; and
   determining a contour using the first layout and the second optical model, wherein the contour predicts a pattern that would be generated if the first layout is corrected using optical proximity correction and then printed using the photolithography process.

4. The method of claim 3, wherein determining a contour includes:

determining a set of values by convolving the second optical model with the first layout at a set of evaluation points in the first layout; and comparing the set of values with a threshold.

5. The method of claim 1, wherein the second optical model is represented as a summation of weighted kernels, wherein the kernels are weighted using kernel coefficients, and wherein the method comprises storing the kernel coefficients in a computer-readable storage-medium.

6. The method of claim 1, wherein determining the second optical model includes determining matrix A so that $M_{opc}^T \otimes U \approx M_o^T \otimes UA$, where $M_o^T$ is a transpose of the test layout's transmission function, $M_{opc}^T$ is a transpose of the corrected test layout's transmission function, and U is the first optical model.

7. The method of claim 6, wherein the first dataset includes values $M_{o,i}^T \otimes K_j$, which represents the convolution of the transpose of the test layout's transmission function, $M_o^T$, with kernel $K_j$ at sample point i;

wherein the second dataset includes values $M_{opc,i}^T \otimes K_j$, which represents the convolution of the transpose of the corrected test layout's transmission function, $M_{opc}^T$, with kernel $K_j$ at sample point i; and wherein determining matrix A includes fitting the first dataset and the second dataset using a least squares fitting technique.

8. A computer-readable storage medium storing instructions that when executed by a computer cause the computer to perform a method for determining an optical model that models effects of optical proximity correction, the method comprising:

receiving a first optical model which is represented using kernels;

receiving a test layout;

determining a first dataset by convolving the kernels with the test layout at sampling points in the test layout;

applying optical proximity correction to the test layout to obtain a corrected test layout, wherein the optical proximity correction is determined using the first optical model;

determining a second dataset by convolving the kernels with the corrected test layout at the sampling points in the corrected test layout; and determining a second optical model using the first dataset and the second dataset, wherein convolving the second optical model with the test layout is substantially equal to convolving the first optical model with the corrected test layout.

9. The computer-readable storage medium of claim 8, wherein the first optical model models effects of a photolithography process, but does not model effects of optical proximity correction; and wherein the second optical model models effects of the photolithography process and optical proximity correction.

10. The computer-readable storage medium of claim 9, comprising:

receiving a first layout to which optical proximity correction has not been applied; and determining a contour using the first layout and the second optical model, wherein the contour predicts a pattern that would be generated if the first layout is corrected using optical proximity correction and then printed using the photolithography process.

11. The computer-readable storage medium of claim 10, wherein determining a contour includes:

determining a set of values by convolving the second optical model with the first layout at a set of evaluation points in the first layout; and comparing the set of values with a threshold.

12. The computer-readable storage medium of claim 8, wherein the second optical model is represented as a summation of weighted kernels, wherein the kernels are weighted using kernel coefficients, and wherein the method comprises storing the kernel coefficients in a second computer-readable storage-medium.

13. The computer-readable storage medium of claim 8, wherein determining the second optical model includes determining matrix A so that $M_{OPC}^T \otimes U \approx M_0^T \otimes UA$, where $M_0^T$ is a transpose of the test layout's transmission function, $M_{OPC}^T$ is a transpose of the corrected test layout's transmission function, and U is the first optical model.

14. The computer-readable storage medium of claim 13, wherein the first dataset includes values $M_{0,i}^T \otimes K_j$, which represents the convolution of the transpose of the test layout's transmission function, $M_0^T$ with kernel $K_j$ at sample point i;

wherein the second dataset includes values $M_{OPC,i}^T \otimes K_j$, which represents the convolution of the transpose of the corrected test layout's transmission function, $M_{OPC}^T$, with kernel $K_j$ at sample point i; and wherein determining matrix A includes fitting the first dataset and the second dataset using a least squares fitting technique.

15. An apparatus for determining an optical model that models effects of optical proximity correction, the apparatus comprising:

a first receiving mechanism configured to receive a first optical model which is represented using kernels;

a second receiving mechanism configured to receive a test layout;

a first determining mechanism configured to determine a first dataset by convolving the kernels with the test layout at sampling points in the test layout;

an applying mechanism configured to apply optical proximity correction to the test layout to obtain a corrected test layout, wherein the optical proximity correction is determined using the first optical model;

a second determining mechanism configured to determine a second dataset by convolving the kernels with the corrected test layout at the sampling points in the corrected test layout; and a third determining mechanism configured to determine a second optical model using the first dataset and the second dataset, wherein convolving the second optical model with the test layout is substantially equal to convolving the first optical model with the corrected test layout.

16. The apparatus of claim 15, wherein the first optical model models effects of a photolithography process, but does not model effects of optical proximity correction; and wherein the second optical model models effects of the photolithography process and optical proximity correction.

17. The apparatus of claim 16, comprising:

a third receiving mechanism configured to receive a first layout to which optical proximity correction has not been applied; and a fourth determining mechanism configured to determine a contour using the first layout and the second optical model, wherein the contour predicts a pattern that would be generated if the first layout is corrected using optical proximity correction and then printed using the photolithography process.

18. The apparatus of claim 17, wherein the fourth determining mechanism is configured to:
determine a set of values by convolving the second optical model with the first layout at a set of evaluation points in the first layout; and
compare the set of values with a threshold.

19. The apparatus of claim 15, wherein the second optical model is represented as a summation of weighted kernels, wherein the kernels are weighted using kernel coefficients, and wherein the apparatus is configured to store the kernel coefficients in a computer-readable storage-medium.

20. The apparatus of claim 15, wherein the third determining mechanism is configured to determine matrix A so that $M_{OPC}^T \otimes U \approx M_0^T \otimes UA$, where $M_0^T$ is a transpose of the test layout's transmission function, $M_{OPC}^T$ is a transpose of the corrected test layout's transmission function, and U is the first optical model.

* * * * *

UNITED STATES PATENT AND TRADEMARK OFFICE
CERTIFICATE OF CORRECTION

| | | |
|---|---|---|
| PATENT NO. | : 7,788,630 B2 | Page 1 of 1 |
| APPLICATION NO. | : 11/726505 | |
| DATED | : August 31, 2010 | |
| INVENTOR(S) | : Jianliang Li et al. | |

It is certified that error appears in the above-identified patent and that said Letters Patent is hereby corrected as shown below:

Title Page

On the first page of the patent, item (75) the second inventor's name should be --Qiliang Yan--.

Signed and Sealed this
Twenty-seventh Day of October, 2015

Michelle K. Lee
*Director of the United States Patent and Trademark Office*